United States Patent [19]
Kobayashi

[11] Patent Number: 5,380,222
[45] Date of Patent: Jan. 10, 1995

[54] CONNECTOR FOR CIRCUIT BOARDS, AND DEVICE USING SAME

[75] Inventor: Shigeyuki Kobayashi, Tokyo, Japan

[73] Assignee: Canon Kabushiki Kaisha, Tokyo, Japan

[21] Appl. No.: 46,193

[22] Filed: Apr. 12, 1993

[30] Foreign Application Priority Data

Apr. 16, 1992 [JP] Japan ............................ 4-096464
Nov. 13, 1992 [JP] Japan ............................ 4-303940

[51] Int. Cl.⁶ ......................................... H01R 13/40
[52] U.S. Cl. ........................................ 439/590; 439/78
[58] Field of Search .............. 439/586, 590, 709, 717, 439/78, 83, 937; 206/329, 330

[56] References Cited

U.S. PATENT DOCUMENTS 3,517,803  6/1970  Frompovicz et al. ............ 206/329
4,072,376  2/1978  Shannon ............................ 439/590

FOREIGN PATENT DOCUMENTS 1252262  10/1967  Germany ............................ 439/590

*Primary Examiner*—David L. Pirlot
*Attorney, Agent, or Firm*—Fitzpatrick, Cella, Harper & Scinto

[57] ABSTRACT

Disclosed is a circuit board connector in which stress will not be produced in solder even if there is a change in ambient temperature, and in which it is possible to reduce residual stress, which accompanies hardening of the solder, produced by a difference in heat shrinkage between the circuit board and the connector, thereby making it possible to prevent cracking of the solder and peeling off of circuit patterns. The circuit board connector has a plurality of electrical contacts arranged in a row on a connector body, the connector body including a plurality of holding portions for independently holding respective ones of the plurality of electrical contacts, and deformable portions flexibly interconnecting the plurality of holding portions in such a manner that the holding portions are capable of moving relative to one another.

4 Claims, 17 Drawing Sheets

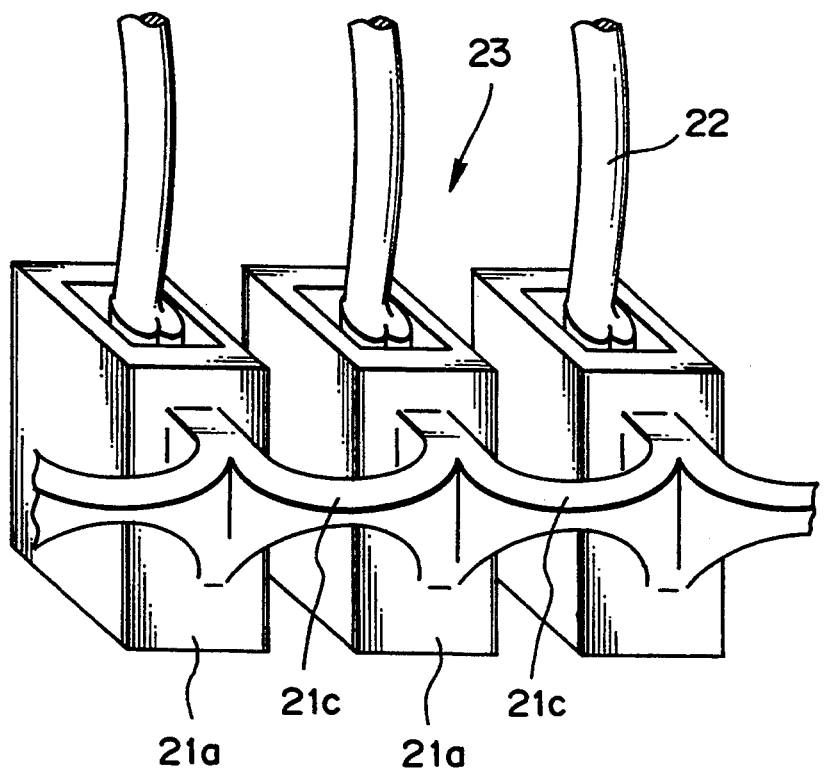

CONNECTOR FOR CIRCUIT BOARDS, AND DEVICE USING SAME

BACKGROUND OF THE INVENTION

This invention relates to a circuit board connector mounted on a circuit board, as well as to an electric device using this connector.

Various circuit board connectors for being mounted on printed circuit boards are known in the art. A connector of this type has a male connector portion constituted by a plurality of connector pins provided on a printed circuit board, and a female connector portion for achieving electrical contact and connection with the male connector portion. The female connector portion is additionally so adapted that it will not become disconnected inadvertently from the male connector portion. These two connector portions constitute one set. Circuit board connectors of this kind may be classified broadly into straight-type connectors and edge-type connectors. In straight-type connectors, the connector pins are provided on the mounting surface of the circuit board in a substantially upstanding attitude. In the edge-type connectors, the connector pins are bent at a right angle at a point along their length so as to be made substantially parallel to the mounting surface of the circuit board.

A conventional straight-type connector for a circuit board will be described in brief with reference to the drawings. FIG. 1 is a side view illustrating a circuit board connector according to the prior art. As shown in FIG. 1, the connector has a male connector portion 100 and a female connector portion 102 forming one set. The female connector portion 102 internally incorporates a connector terminal 106 (indicated by the broken lines) to which a solid wire 104 or flat cable (not shown) is connected. The connector terminal 106 has a resilient portion which, when a connector pin 108 is inserted into it, undergoes elastic deformation so as to produce a retaining force by which the connector terminal 106 and connector pin 108 are joined together to assure an electrical connection between them.

Through a method in which the male connector portion 100 is insert-molded with or press-fitted into a block body 110 consisting of synthetic resin, the connector pin 108 is attached so as to assume an upright attitude on the mounting surface of a circuit board 112. After an end portion 108a of the connector pin 108 is passed through a land hole of a circuit pattern formed on the surface of the circuit board 112, solder 114 is formed on each connector pin 108 by a soldering device or the like. As a result, the male connector portion 100 is mechanically and electrically joined to the circuit board 112.

By attaching the female connector portion 102 to or detaching it from the male connector portion 100 thus joined to the circuit board 112, the circuit board 112 is connected to or disconnected from an external electric circuit.

In actual use, the circuit board 112 is exposed to conditions over a wide temperature range (e.g., −10° C.~85° C.). Consequently, in the prior-art connector of the kind described above, the block body 110 constituting the male connector portion 100 expands or contracts owing to change in the ambient temperature. This is accompanied by a change in the spacing between the connector pins 108, as a result of which the spacing between the connector pins 108 may no longer match the spacing between the land holes of the circuit board 112. In actuality, the circuit board 112 also expands or contracts in the same direction as the block body 110 so that the magnitude of the offset between the pins 108 and land holes is somewhat mitigated. However, since the material constituting the block body 110 and the material constituting the circuit board 112 have different thermal conductivities, a discrepancy always develops between the spacing of the connector pins 108 and the spacing of the land holes in the circuit board 112. This discrepancy in spacing causes stress to develop in the solder 114.

Further, when the connector pin 108 is soldered to the circuit board 112, the hardening of the solder 114 gives rise to a difference in thermal shrinkage between the block body 110 and circuit board 112. This difference in thermal shrinkage also causes residual stress in the solder 114. This stress produced in the solder 114 can cause the solder to crack, as shown in FIG. 2, or can cause the circuit pattern to peel off. When the solder cracks or the circuit pattern peels off, this can cause a break in a signal line of an electric circuit and result in an accident or malfunction.

Recent reductions in the size of electric devices and an increase in the mounting density of electric and electronic parts have been accompanied by a change in the shapes of connectors on circuit boards. For example, in a case where a connector having a plurality of connector pins is mounted on a circuit board, generally the plurality of connector pins are arrayed in a single straight row. In recent years, however, cases have arisen in which the connector pins must be arrayed irregularly and not linearly.

When the plurality of connector pins are attached to one block body in the above-mentioned case in which the connector pins are arrayed irregularly, instances arise in which the connector pins do not fit into the land holes smoothly owing to an error in the spacing between the connector pins and an error in the spacing between the land holes of the circuit board. If the connector pins are forcibly pushed into the land holes under such circumstances, the connector pins develop residual stress that tends to spread the pins apart or force them closer together, as a result of which the solder tends to crack. Consequently, in a case where the connector pins must be arrayed irregularly, the arrangement adopted in the prior art is one in which mutually independent connectors 116 are fitted into a circuit board 118 one at a time, as illustrated in FIG. 3. However, if the connectors 116 are thus mounted one at a time, it is easy to make mistakes when inserting the connector pins. Accordingly, it is necessary to take great care when the connectors 116 are mounted on the circuit board, and the operation involved is highly inefficient.

Besides cases in which connector pins are arrayed irregularly on the same plane, there are also cases in which connector pins are arrayed on two circuit boards not located on the same plane. For example, FIG. 4 illustrates a side section of a word processor. Here a CRT, two circuit boards 122A, 122B and a power supply 114 are accommodated within a case 120 of the word processor. It is necessary for the two circuit boards 122A, 122B to be electrically interconnected, and it is also required for the circuit boards to be connected to the power supply 114. In such cases also, a variance in the difference in the levels of the circuit boards, a variance in the spacing of the circuit boards and a variance in the dimensions of the block body of the connector cause residual stress to act upon the connector pins when the connectors are joined. Consequently, it is still necessary to separate the connectors one at a time and the aforesaid problem still arises, namely the fact that errors tend to occur when inserting the connector pins.

SUMMARY OF THE INVENTION

Accordingly, an object of the present invention is to provide a circuit board connector in which stress will not be produced in solder even if there is a change in ambient temperature, thereby making it possible to prevent cracking of the solder and peeling off of circuit patterns.

Another object of the present invention is to provide a circuit board connector in which it is possible to reduce residual stress, which accompanies hardening of the solder, produced by a difference in heat shrinkage between the circuit board and the connector, thereby making it possible to prevent cracking of the solder and peeling off of circuit patterns.

Still another object of the present invention is to provide a circuit board connector in which connector pins will not be subjected to excessive force even if the connector pins must be arrayed irregularly.

A further object of the present invention is to provide a circuit board connector in which connector pins can be arranged across two or more circuit boards that are not coplanar.

A further object of the present invention is to provide an electric device having two or more circuit boards that are not coplanar, wherein the circuit boards are connected by a single connector.

In order to attain the foregoing objects, the present invention provides a circuit board connector in which a plurality of connector pins arranged in a row on a connector body are passed through circuit-pattern holes of a circuit board and then soldered, thereby electrically connecting the connector pins to the circuit board, wherein the connector body has a plurality of holding portions for independently holding respective ones of the plurality of connector pins, and comparatively low-rigidity portions disposed between mutually adjacent ones of the plurality of holding portions, the low-rigidity portions readily deforming in a direction in which the connector pins are arrayed.

Owing to the deformation of the low-rigidity portions between the holding portions in the circuit board connector of the invention constructed as described above, error in the spacing of the land holes of the circuit board and a difference in thermal expansion are absorbed so that residual stress in soldered portions can be reduced. This makes it possible to prevent cracking of the solder and peeling off of the circuit patterns.

The present invention further provides an electric device having at least two circuit boards on mutually different levels, the circuit boards being connected by the above-described circuit board connector.

Other objects and advantages besides those discussed above shall be apparent to those skilled in the art from the description of a preferred embodiment of the invention that follows. In the description, reference is made to the accompanying drawings, which form a part thereof, and which illustrate an example of the invention. Such example, however, is not exhaustive of the various embodiments of the invention, and therefore reference is made to the claims which follow the description for determining the scope of the invention.

BRIEF DESCRIPTION OF THE DRAWING

FIG. 14 is a perspective view showing a first modification of the female portion of the circuit board connector of the fifth embodiment;

DESCRIPTION OF THE PREFERRED EMBODIMENTS

Preferred embodiments of the present invention will now be described in detail with reference to the accompanying drawings. The circuit board connector described in the following embodiments is of the straight type mentioned earlier.

FIRST EMBODIMENT

Figure 1:
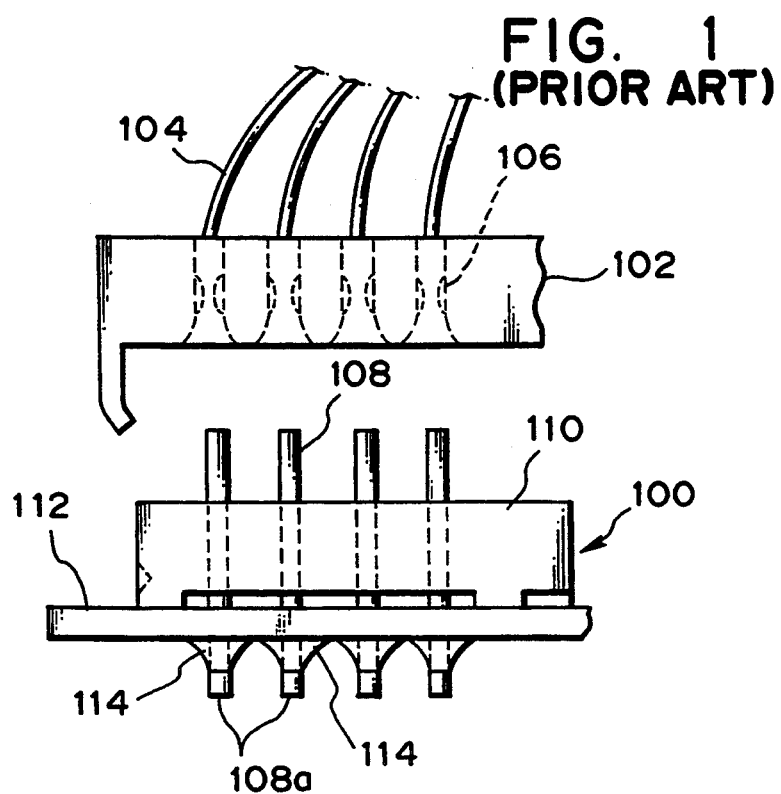
FIG. 1 is a diagram showing the structure of a circuit board connector according to the prior art.
Figure 2:
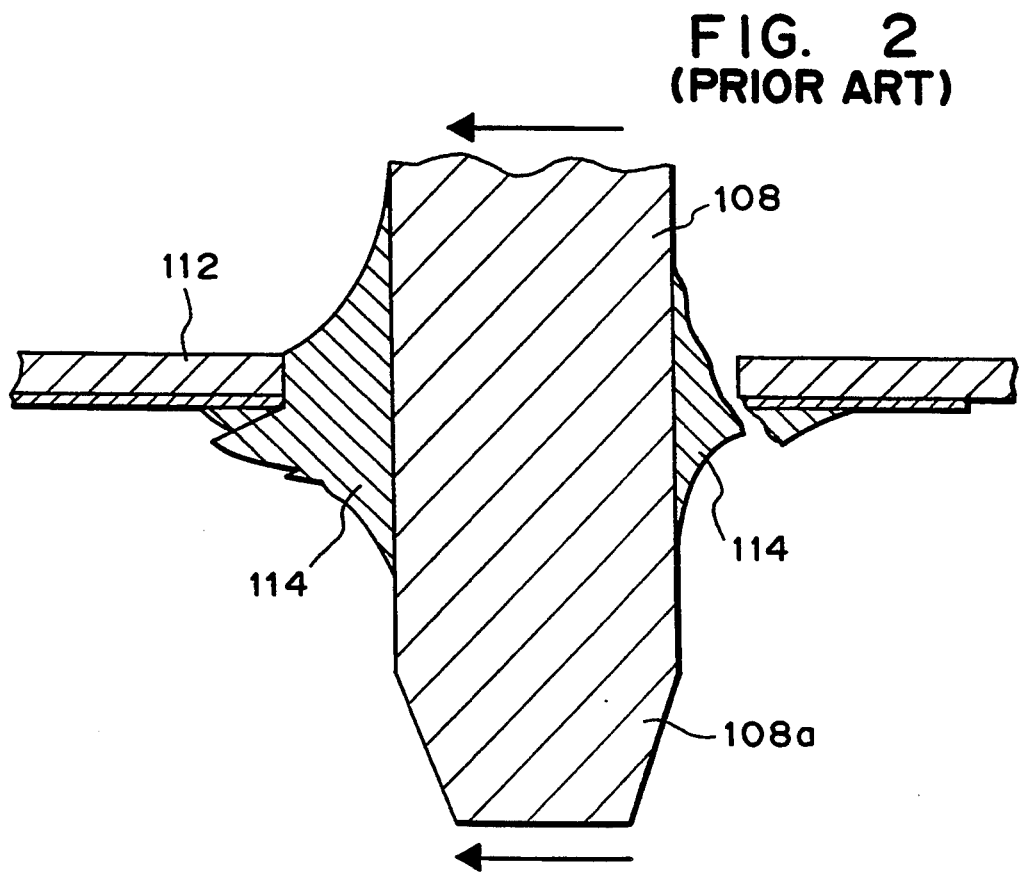
FIG. 2 is a diagram showing solder cracks.
Figure 3:
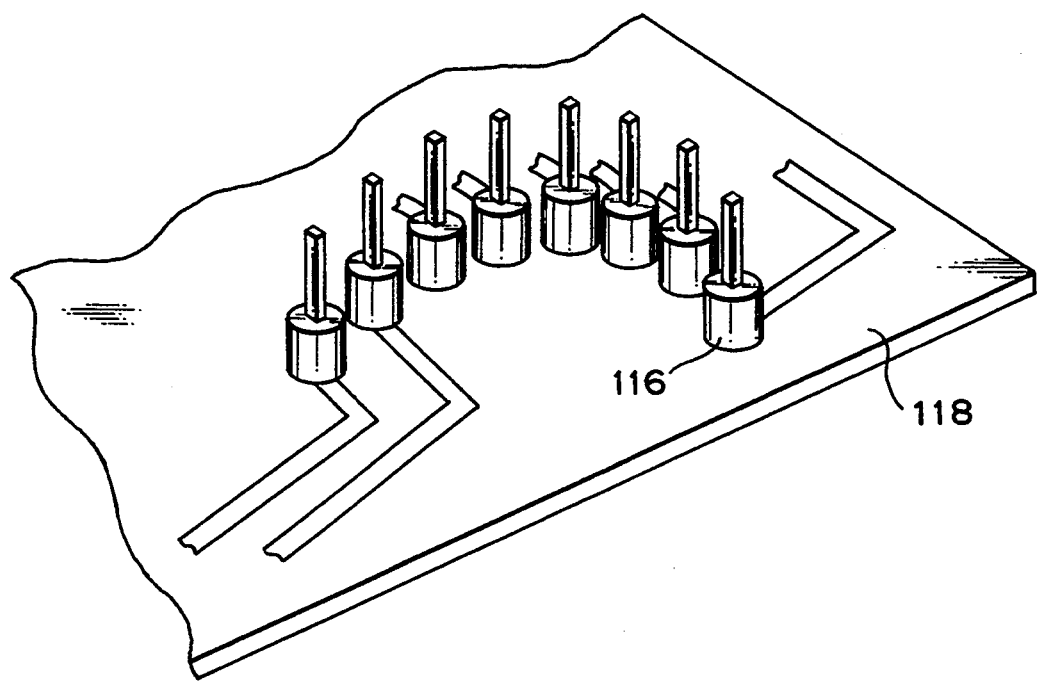
FIG. 3 is a diagram showing the structure of a conventional connector in a case where connector pins are arrayed irregularly.
Figure 4:
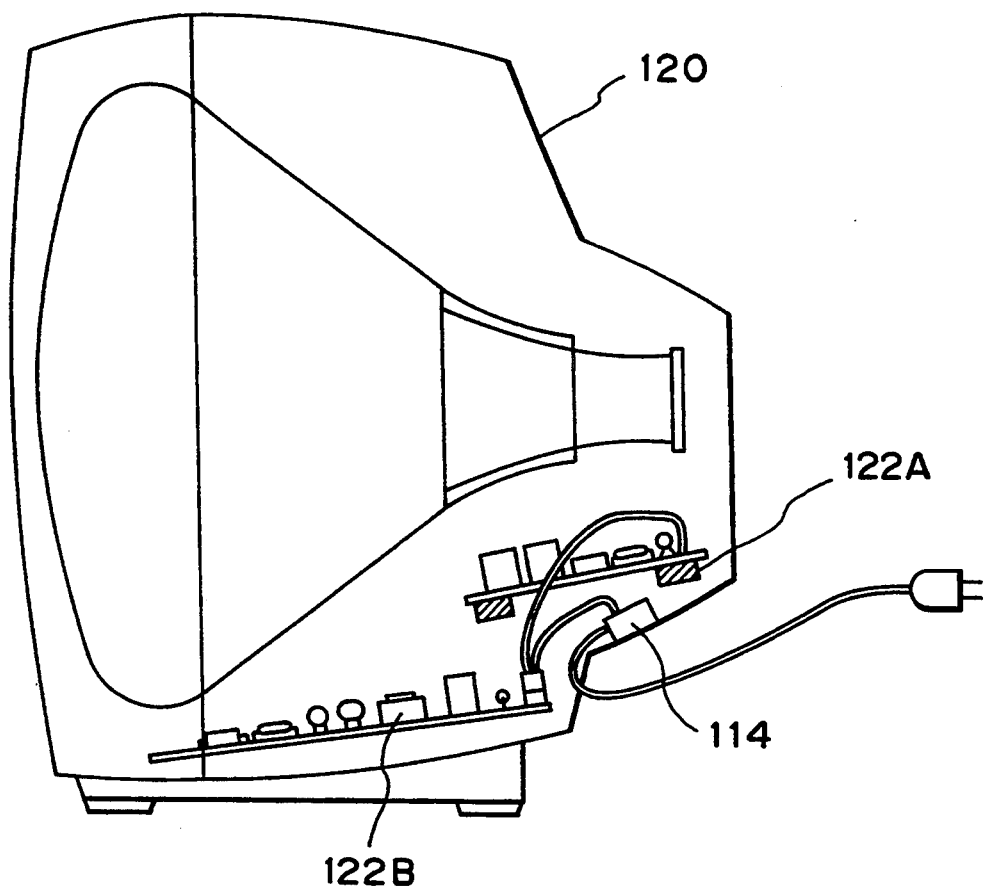
FIG. 4 is a diagram showing circuit boards in a connected state within a personal computer in the prior art.
Figure 5:
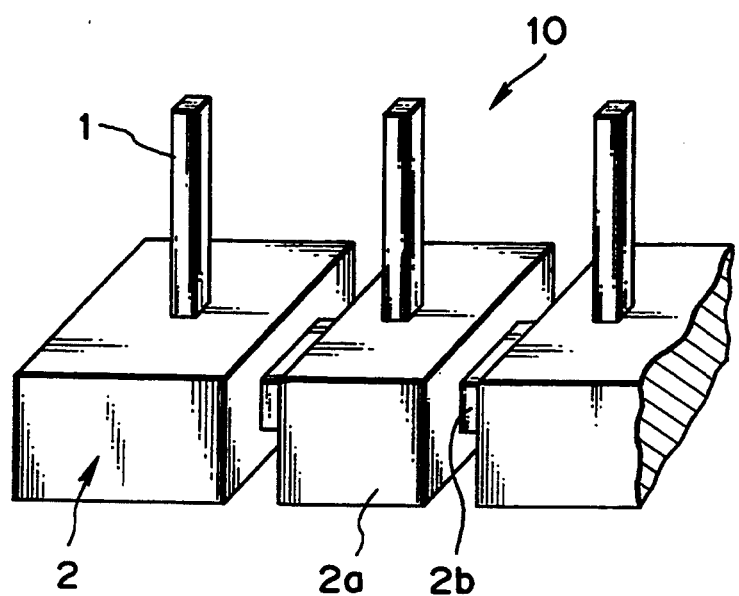
FIG. 5 is an external perspective view showing the structure of a male portion of a circuit board connector according to a first embodiment of the present invention.
Figure 6:
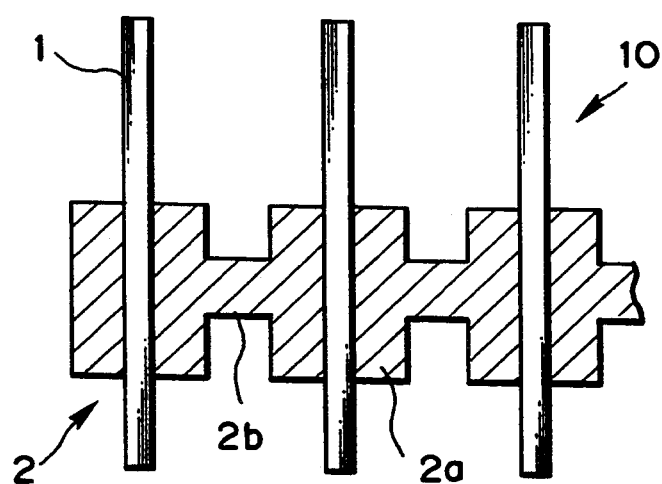
FIG. 6 is a side section of FIG. 5.

FIG. 5 is an external perspective view showing the structure of a male portion 10 of a circuit board connector according to a first embodiment of the present invention, and FIG. 6 is a side section of FIG. 5.

As shown in FIGS. 5 and 6, the male portion 10 of the circuit board connector is constituted by a plurality of connector pins 1 and a connector body 2 consisting of a synthetic resin or the like. The plurality of connector pins 1 are disposed on the connector body 2 in an upstanding attitude and are spaced apart at a fixed spacing along the longitudinal direction of the connector body. The connector pins 1 are integrally molded with the connector body 2 by insert injection molding when the connector body 2 is molded. Alternatively, the connector pins 1 are attached to the connector body 2 as by a press fitting method executed after molding. Each connector pin 1 is obtained by shaping a material such as copper into a prismatic shape and subjecting the surface of each pin to gold plating or the like. By providing the connector pins 1 with a prismatic shape, it is possible to obtain a large surface area that bears the retaining force of the connector terminals disposed on the female portion of the connector. This also makes it possible to prevent the connector pins from falling out after they are insert molded or press fitted.

As illustrated in FIGS. 5 and 6, the connector body 2 has block-shaped holding portions 2a each for holding one of the connector pins 1, and beam portions (readily deformable portions) 2b, of a small surface area, each situated between mutually adjacent ones of the holding portions 2a.

In a case where the male portion 10 of the circuit board connector constructed as set forth above has been soldered to a circuit board, a difference in thermal shrinkage between the circuit board and connector body 2 that accompanies hardening of the solder is absorbed by the tensile and compressive deformation of the beam portions 2b. As a result, the connector pins 1 do not become skewed and cracking of the solder due to residual stress after soldering is prevented. Further, in actual use of the connector upon the conclusion of soldering, any difference in thermal expansion between the circuit board and the connector body 2 due to a change in ambient temperature is absorbed by deformation of the beam portions 2b. This also contributes to the prevention of cracking of the solder. Furthermore, if the connector pins 1 are large in number, any error in the dimensions from one connector pin to another is absorbed by the deformation of the beam portions 2b. This makes it unnecessary to separate the connector body 2 into a plurality of individual portions to disperse the dimensional error.

In a case where the same compressing loading or the same tensile loading is borne, the smaller the cross sectional area of the beams 2b, the greater the action by which the beams 2b absorb a difference in thermal shrinkage (or a difference in thermal expansion) between the circuit board and the connector body 2, providing the same material is used. The reason for this is that the smaller the cross sectional area, the larger the load per unit area and the greater the dimensional change (contraction, collapse, elongation, etc.). Accordingly, the degree of absorption of a difference in thermal shrinkage (a difference in thermal expansion) between the circuit board and the connector body 2 differs depending upon a difference in the length and a difference in the cross sectional area of the beam portions 2b, and therefore the beam portions 2b should be set to optimum dimensions as necessary.

SECOND EMBODIMENT

Figure 7:
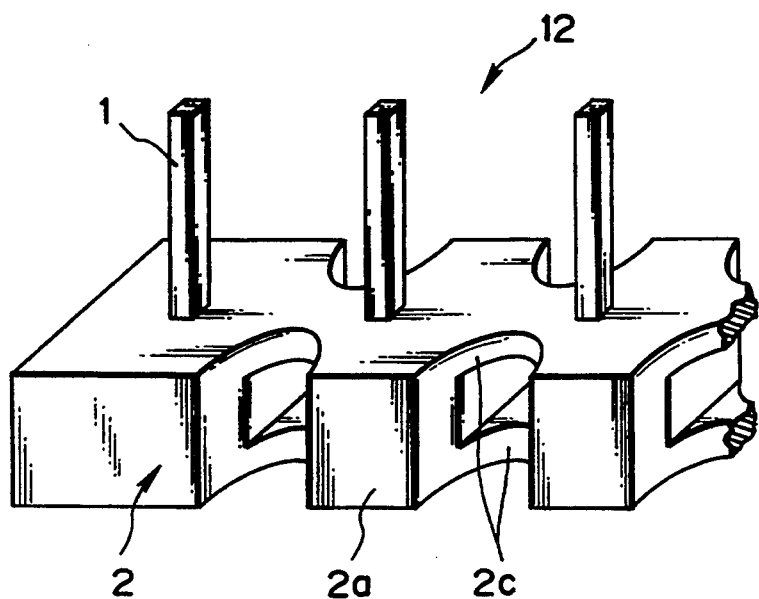
FIG. 7 is an external perspective view showing the structure of a male portion of a circuit board connector according to a second embodiment of the present invention.
Figure 8:
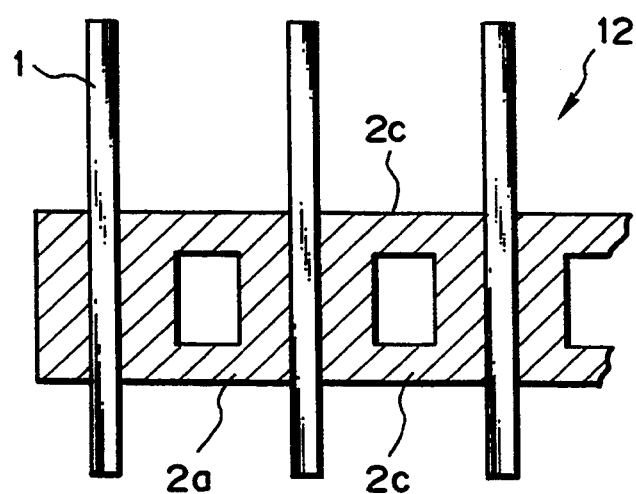
FIG. 8 is a side section of FIG. 7.

FIG. 7 is an external perspective view showing the structure of a male portion 12 of a circuit board connector according to a second embodiment of the present invention, and FIG. 8 is a side section of FIG. 7.

In the second embodiment, the beam portion 2b of the first embodiment is replaced by beam portions 2c disposed on upper and lower parts of the holding portions 2a. Other portions are identical with those of the first embodiment and are designated by like reference characters. These portions need not be described again.

In the second embodiment also, a difference in thermal shrinkage (a difference in thermal expansion) between the circuit board and the connector body 2 can be absorbed by the tensile and compressive deformation of the beam portions 2c. Solder cracking can be prevented in exactly the same manner as in the prior art. Further, in a case where the number of connector pins 1 is large, any error in the dimensions from one connector pin to another is absorbed by the deformation of the beam portions 2c. This makes it unnecessary to separate the connector body 2 into a plurality of individual portions to disperse the dimensional error.

THIRD EMBODIMENT

Figure 9:
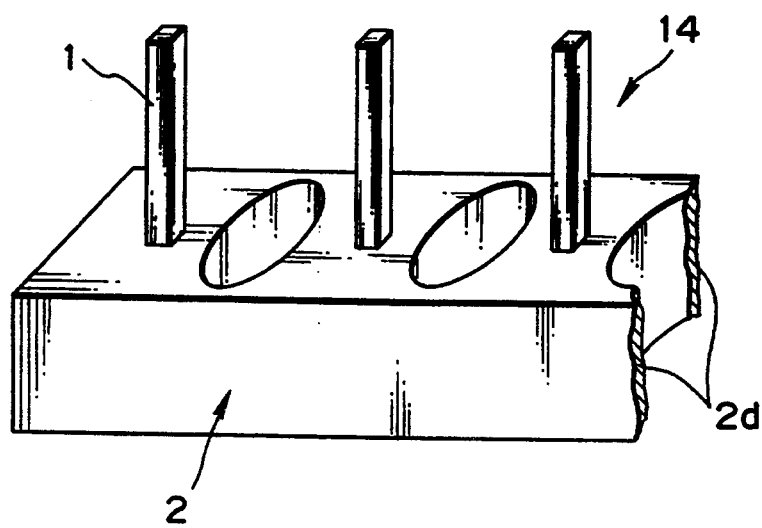
FIG. 9 is an external perspective view showing the structure of a male portion of a circuit board connector according to a third embodiment of the present invention.
Figure 10:
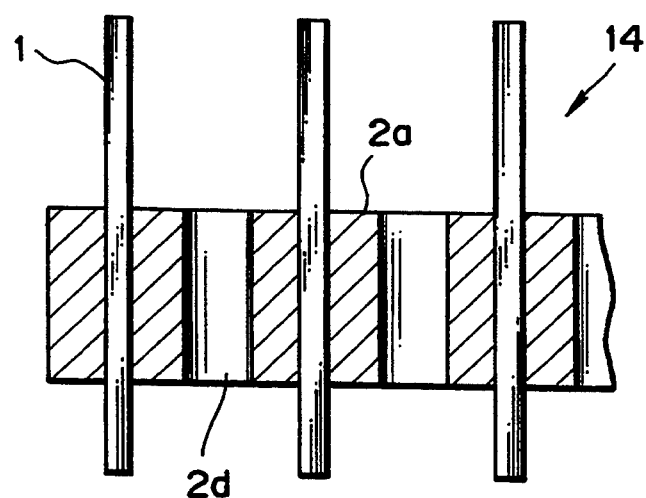
FIG. 10 is a side section of FIG. 9.

FIG. 9 is an external perspective view showing the structure of a male portion 14 of a circuit board connector according to a third embodiment of the present invention, and FIG. 10 is a side section of FIG. 9.

In the third embodiment, the beam portion 2b of the first embodiment is replaced by beam portions 2d disposed on left and right sides of the holding portions 2a. Other portions are identical with those of the first embodiment and are designated by like reference characters. These portions need not be described again.

In the third embodiment also, a difference in thermal shrinkage (a difference in thermal expansion) between the circuit board and the connector body 2 can be absorbed by the deformation of the beam portions 2d. Solder cracking can be prevented in exactly the same manner as in the prior art. Further, in a case where the number of connector pins 1 is large, any error in the dimensions from one connector pin to another is absorbed by the deformation of the beam portions 2d. This makes it unnecessary to separate the connector body 2 into a plurality of individual portions to disperse the dimensional error.

FOURTH EMBODIMENT

Figure 11A:
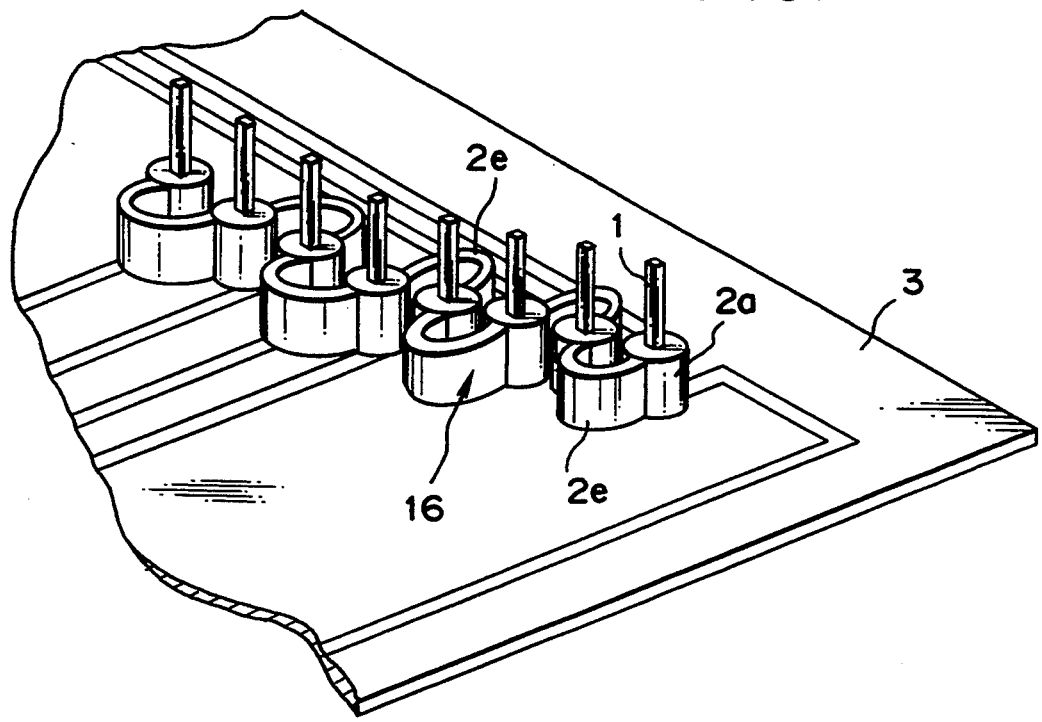
FIG. 11A is a perspective view showing the male portion of a circuit board connector in a state attached to a circuit board according to a fourth embodiment.
Figure 11B:
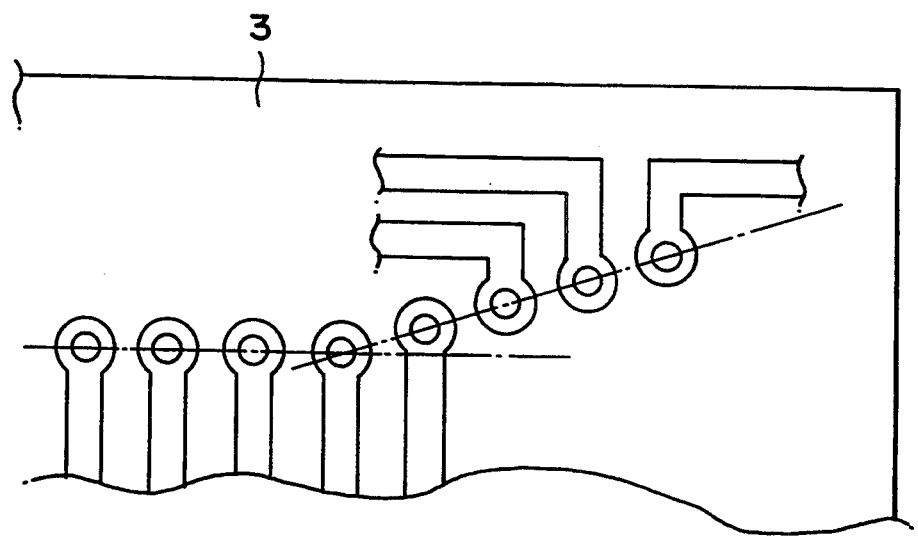
FIG. 11B is a plan view showing the circuit board.

FIG. 11A is a perspective view showing a male portion 16 of a circuit board connector in a state attached to a circuit board 3 according to a fourth embodiment, and FIG. 11B is a plan view showing the circuit board 3.

In the fourth embodiment, the beam portion 2b of the first embodiment is replaced by beam portions 2e formed on the holding portions 2a so as to have a loop-shaped configuration. Other portions are identical with those of the first embodiment and are designated by like reference characters. These portions need not be described again.

In the fourth embodiment, land holes in the circuit board 3 are not all disposed along a straight line but are arrayed along two lines diagonally intersecting each other. In a case such as this, it is difficult for an angular error in the diagonally arrayed land holes to be absorbed using the connector structures of the first through third embodiments. In the fourth embodiment, the beam portions 2e are formed in the shape of loops. As a result, the degree of freedom of deformation of the beam portions 2e is greater in comparison with that of the first through third embodiments so that even an angular error in the array of land holes can be absorbed.

FIFTH EMBODIMENT

Figure 12:
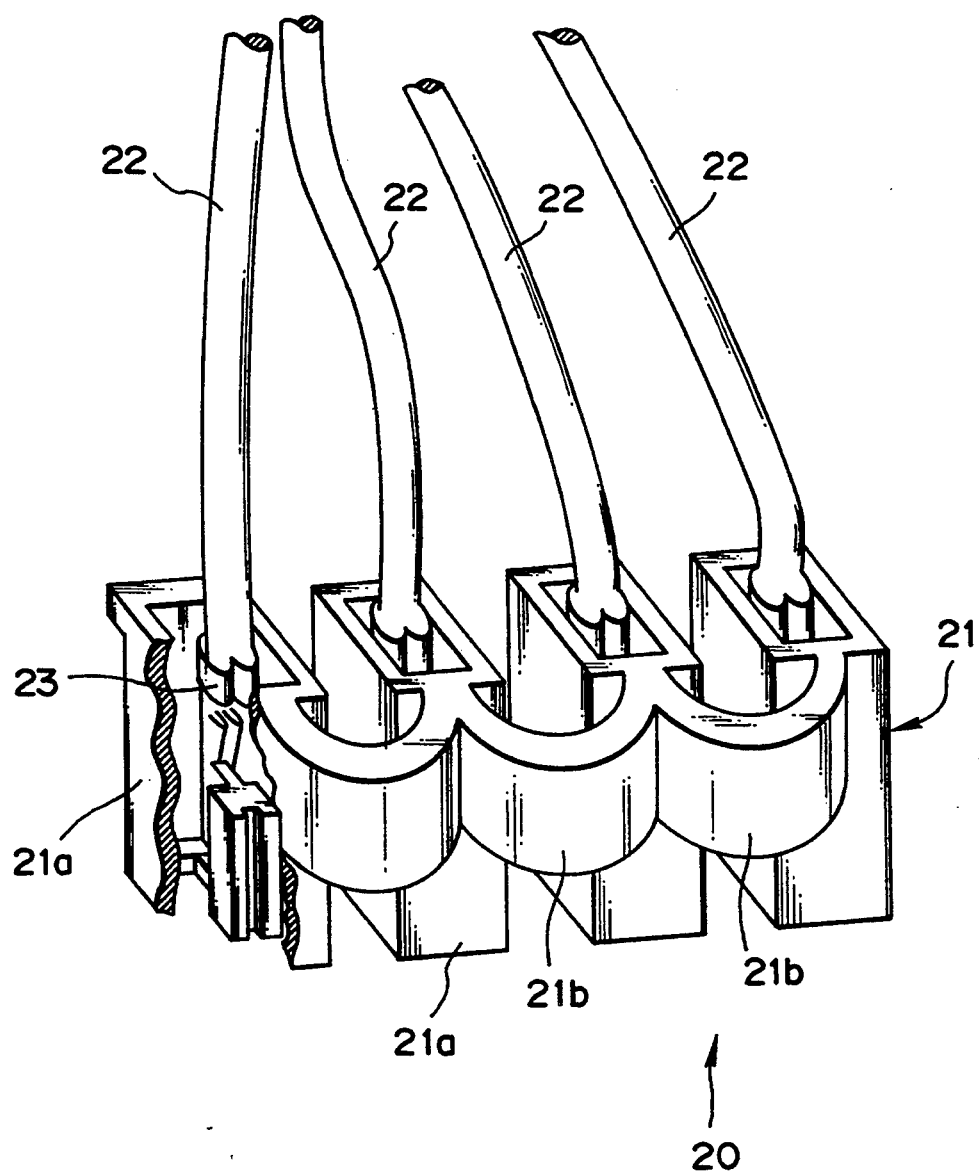
FIG. 12 is a perspective view showing the structure of a male portion of a circuit board connector according to a fifth embodiment of the present invention.

FIG. 12, which represents a fifth embodiment of the invention, shows the structure of a female portion 20 of the circuit board connector. The female portion 20 is used in combination with the male portion of the circuit board connectors of the first through fourth embodiments.

As shown in FIG. 12, the female portion 20 of the circuit board connector comprises a connector body 21, and connector terminals 23 mounted within the connector body 21 and having signal lines 22 connected thereto. The connector body 21, which consists of a resin material, has hollow holding portions 21a for holding the connector terminals 23, and loop-shaped beam portions (readily deformable portions) 21b interconnecting the holding portions 21a. Each connector terminal 23 is inserted into the corresponding hollow holding portion 21a after the holding portions 21a are molded and worked.

If the connector pins develop a spacing error in the male portion that mates with the female portion 20 of the circuit board connector thus constructed, this error is absorbed by deformation of the loop-shaped beam portions 21b so that the distance between the holding portions 21a can be made to conform to the spacing of the connector pins on the male side. As a result, the female portion 20 can be mated with the male portion of the connector without being forced.

Figure 13:
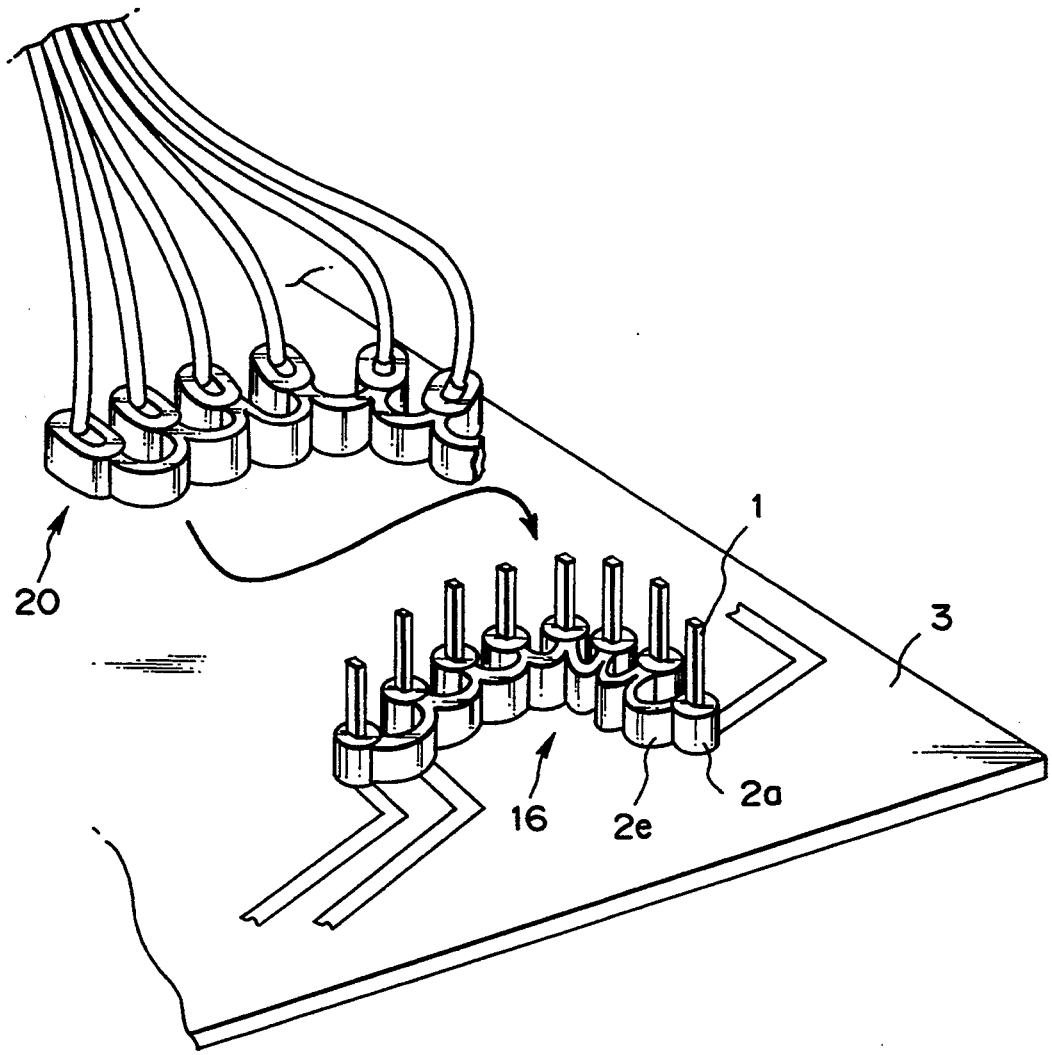
FIG. 13 is a perspective view showing the manner in which a female portion of a circuit board connector of a fifth embodiment is attached to a male portion of a circuit board connector according to the fourth embodiment.

FIG. 13 is a perspective view showing the manner in which the female portion 20 of the circuit board connector according to the fifth embodiment is attached to the male portion 16 of the circuit board connector according to the fourth embodiment. By thus combining the male portion 16 of the connector according to the fourth embodiment and the female portion 20 of the connector according to the fifth embodiment, the male portion 16 and female portion 20 of the connector can be mounted on a circuit board with facility and cracking of the solder due to residual stress can be prevented even if the land holes of the circuit board 3 develop spacing error or the land holes are arrayed irregularly. Further, even if an offset develops between spacing of the land holes in the circuit board 3 and the spacing of the connector pins owing to a change in temperature, this offset can be absorbed by the deformation of the beam portions 2e, 21b so that cracking of the solder can be prevented in a similar manner.

FIG. 14 is a perspective view showing a first modification of the female portion 20 of the circuit board connector according to the fifth embodiment.

In the first modification, beam portions 21c are provided with greater flexibility by being made more slender than the beam portions 21b of the female portion 20 of the connector according to the fifth embodiment. Other structural aspects of this modification are identical with those of the fifth embodiment.

Figure 15A:
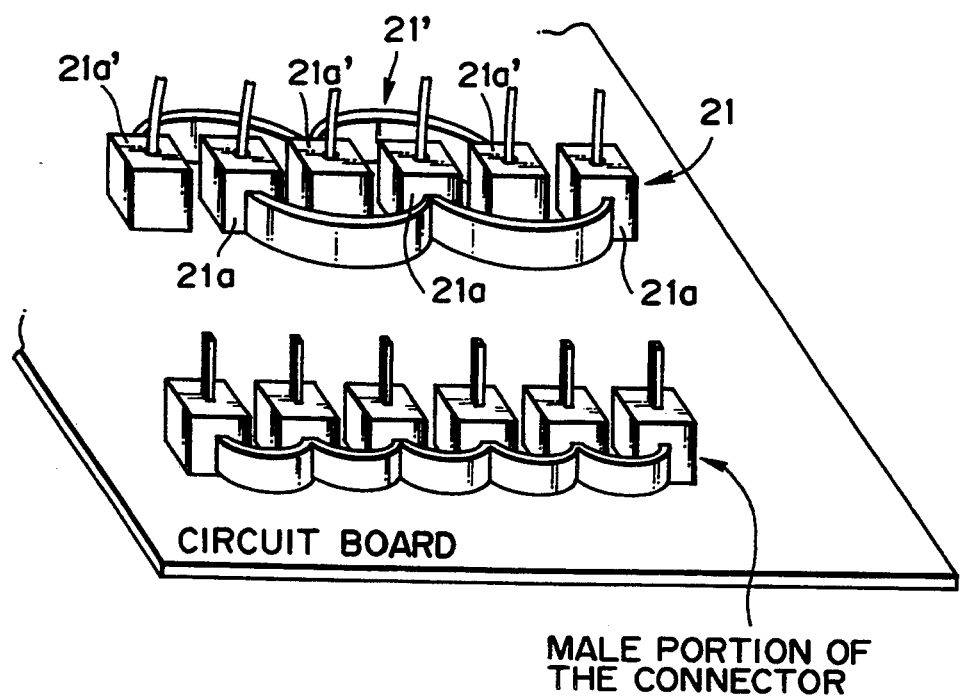
FIG. 15A and 15B are diagrams showing an example of an application in which a plurality of the female portions of the connectors shown in FIGS. 12 and 14 are combined.

FIG. 15A is a diagram showing an example of an application in which a plurality of the female portions 21 or 23 of the connectors shown in FIGS. 12 and 14 are combined. For example, two of female portions 21, 21' of the connector shown in FIG. 12 are used, the holding portions 21a' of the female portion 21' of the one connector are inserted into the corresponding spaces between the holding portions 21a of the female portion 21 of the other connector, and the female portions are used upon being mated with the connector pins of the male portion of the connectors shown in FIG. 15A.

Figure 15B:
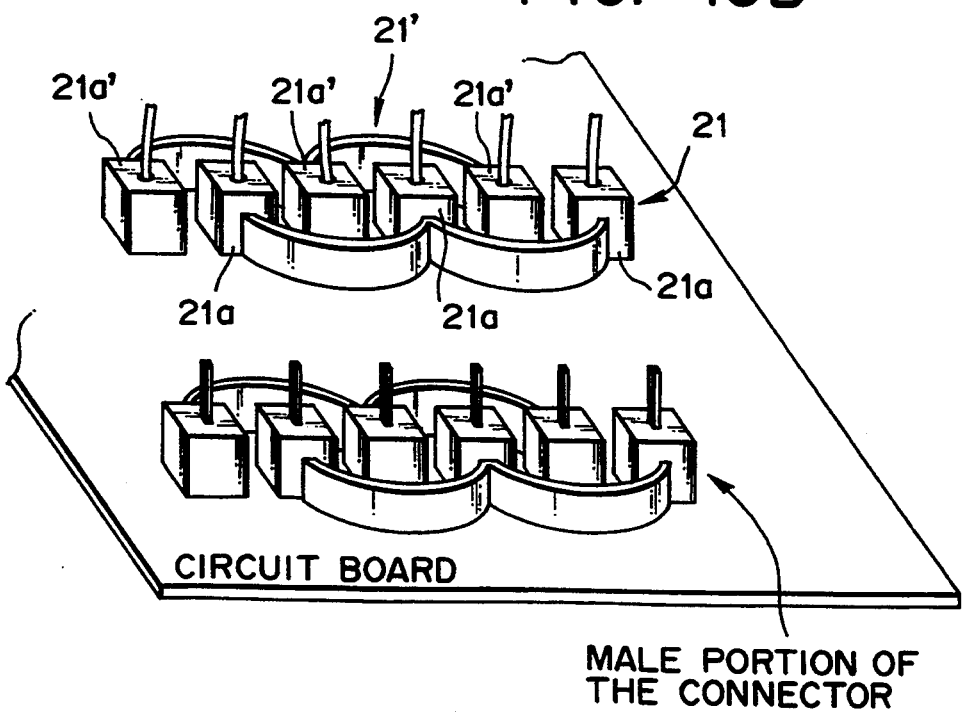

Further, a plurality of the male portions of the connectors can be combined as shown in FIG. 15B.

In this case, it is possible for the two connectors to be distinguished from each other at a glance if the colors of the female portions 21, 21' of the two connectors are made different from each other. This makes it possible to prevent mating of the wrong male and female portions of the connectors.

Figure 16:
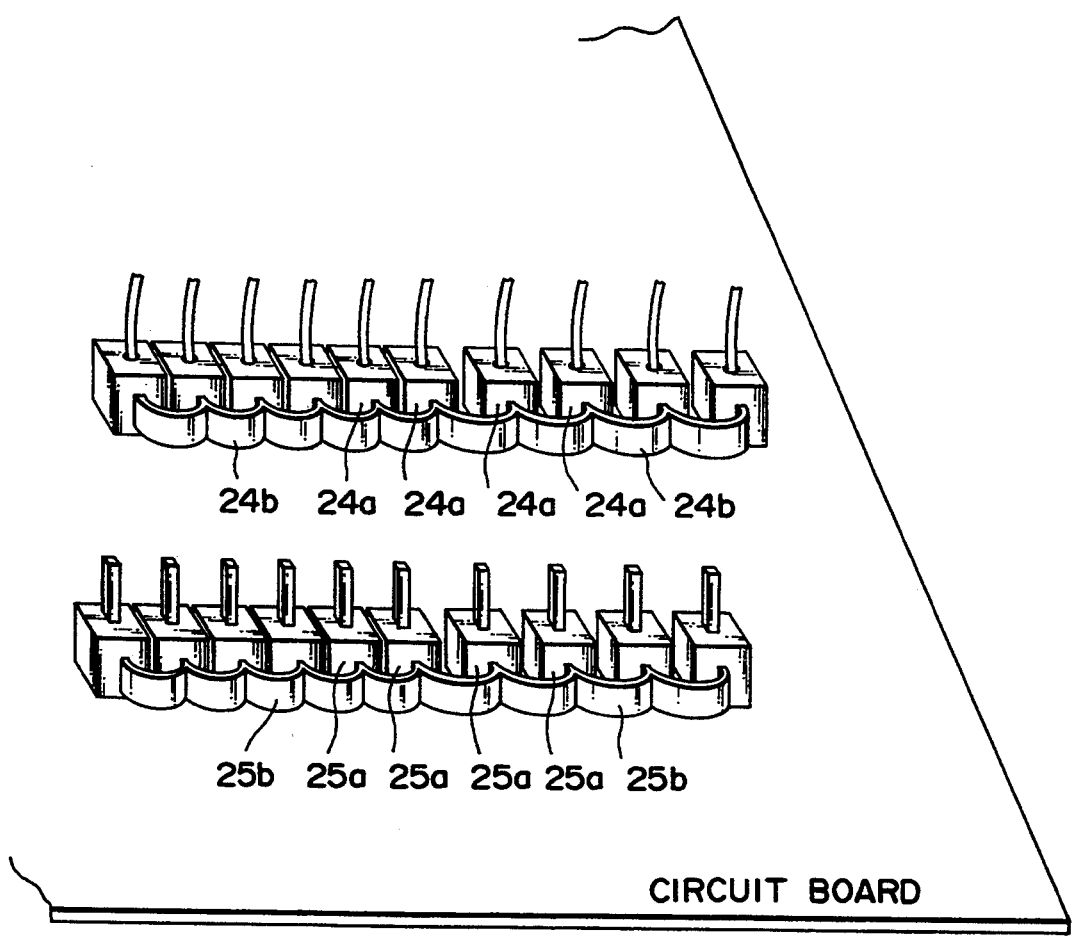
FIG. 16 is a perspective view showing a second modification of the female portion of the connector of the fifth embodiment and male portion of the connector.

FIG. 16 is perspective view showing a second modification of the female portion 20 of the circuit board connector according to the fifth embodiment. In the second modification, holding portions 24a of respective connectors 24 are arranged at an irregular spacing. Also, respective holding portions 25a of the male portions 25 of the connector are arranged at an irregular spacing. This is realized by changing the lengths of beam portions 24b interconnecting the holding portions 24a. By thus setting the spacing of the holding portions 24a to be irregular, any irregularity in the spacing of the land holes in the circuit board can be dealt with by making the spacing of the holding portions 24a correspond thereto.

Figure 17:
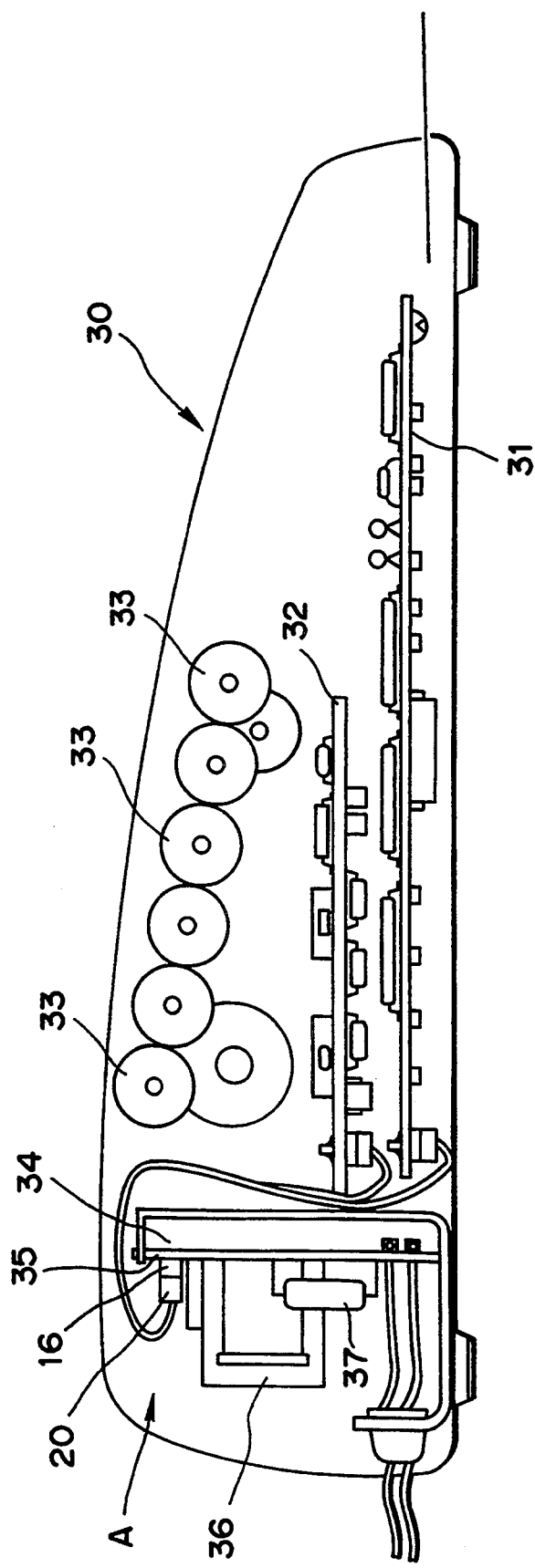
FIG. 17 is a diagram illustrating an example in which the connector shown in FIG. 16 is mounted in a facsimile machine.

FIG. 17 is a diagram illustrating an example in which the connector shown in FIG. 16 is mounted in an electric device, specifically a facsimile machine.

As shown in FIG. 17, circuit boards 31, 32 are disposed within a facsimile machine 30 in the lower part thereof, and a roller group 33 for feeding printing paper is disposed in the upper part of the facsimile machine 30. A power-supply chassis 34 is disposed at the rear of the facsimile machine 30 in an upright attitude. A circuit board 35, transformer 36 and an electronic part 37 are mounted on the power-supply chassis 34, and a male portion 38 of a connector is mounted on the circuit board 35. The male portion 38 of the connector has a structure similar to that of the male portion 16 of the connector shown in FIG. 13. The holding portions in which the connector pins are disposed are interconnected by loop-shaped beam portions. The distances between mutually adjacent holding portions are set to be irregular by being made to conform to the spacing of the land holes in the circuit board 35 in the same manner as the female portion 24 of the connector shown in FIG. 16. The female portion 24 shown in FIG. 16 is mated with the male portion 38 of this connector.

Figure 18:
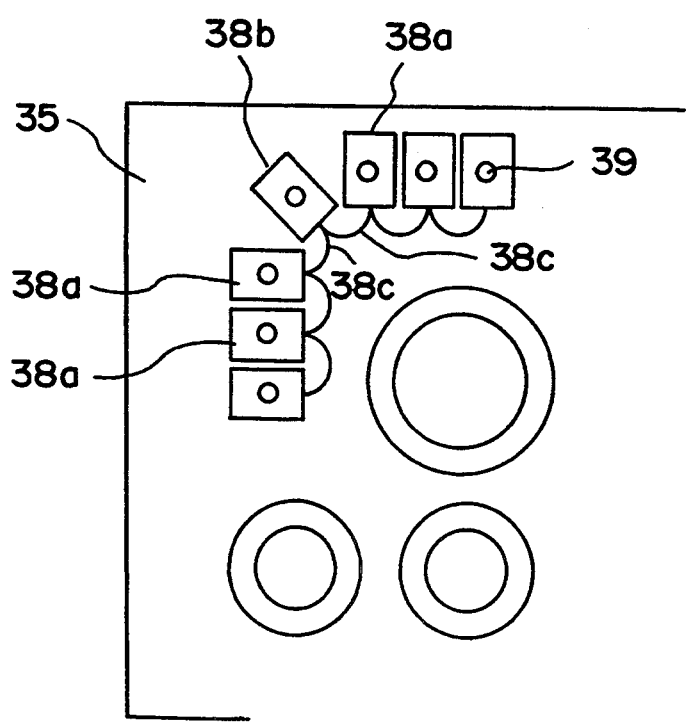
FIG. 18 is a diagram showing the female portion of the connector of FIG. 16 in a state mounted on a circuit board within the facsimile machine.

Here the land holes of the circuit board 35 are arranged non-linearly (i.e., in an L-shaped pattern), and connector pins 39 of the male portion 38 of the connector also are arrayed in an L-shaped pattern along the land holes, as illustrated in FIG. 18. The holding portions of the male portions 38 of the connector are classified into first holding portions 38a and a second holding portion 38b. The spacing between the first holding portions 38a forming the two legs of the "L" is set to be small, and the spacing between the second holding portion 38b, which is located at a position corresponding to the angle of the "L", and the first holding portions 38a on either side is set to be large. As a result, even if spacing between the holding portions at the angle of the "L" widens, the male portion 38 of the connector can be mounted on the circuit board 35 without effort. Similarly, the female portion 24 of the connector also has the spacing between the centrally located holding portion at the angle of the "L" and the holding portions situated on either side thereof set to be large, and the female portions are arranged so as to correspond to the positions of the connector pins 39 of the connector male portion 38.

SIXTH EMBODIMENT

Figure 19:
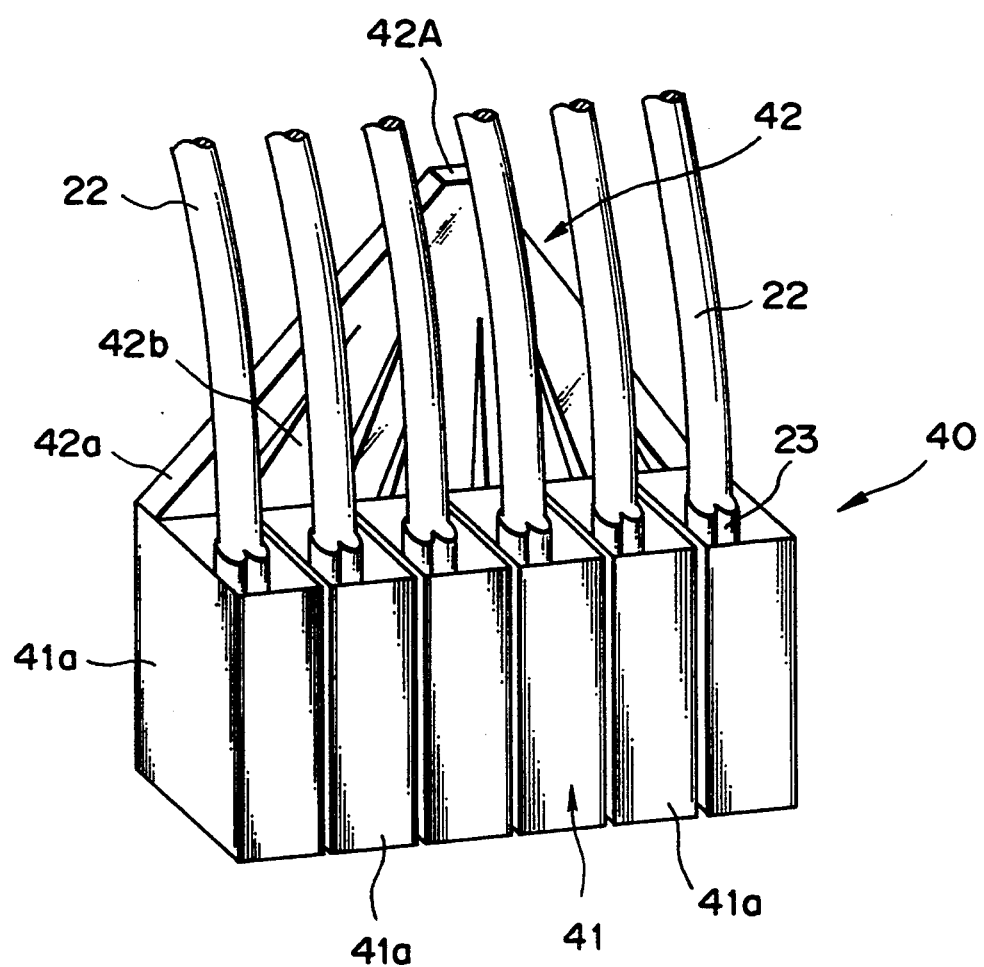
FIG. 19 is a perspective view showing the structure of the female portion of a circuit board connector according to a sixth embodiment.

FIG. 19 is a perspective view showing the structure of a female portion 40 of a circuit board connector according to a sixth embodiment. As shown in FIG. 19 the female portion 40 of the circuit board connector according to the sixth embodiment comprises a connector body 41 and connector terminals 23 fitted into the connector body 41 and having signal lines 22 connected thereto. The connector body 41, which consists of synthetic resin or the like, has hollow holding portions 41a for holding corresponding connector terminals 23, and a connecting portion (readily deformable portion) 42 interconnecting the holding portions 41a, as shown in FIG. 19. The connecting portion 42 has a base 42A and ribs 42a, 42b, . . . diverging from the base 42A in a fan-shaped pattern. The distal ends of the ribs 42a, 42b, . . . are connected to respective ones of the holding portions 41a.

Even if the male portion of the connector that mates with the female portion 40 of the circuit board connector thus constructed develops a spacing error with regard to the connector pins, this spacing error is absorbed owing to deformation of the ribs 42a, 42b, . . . , so that the distance between the holding portions 41a can be made to match the spacing of the connector pins on the male side. As a result, the female portion 40 of the connector can be mated with the male portion of the connector without effort.

Further, cracking of the solder due to residual stress can be prevented.

SEVENTH EMBODIMENT

Figure 20:
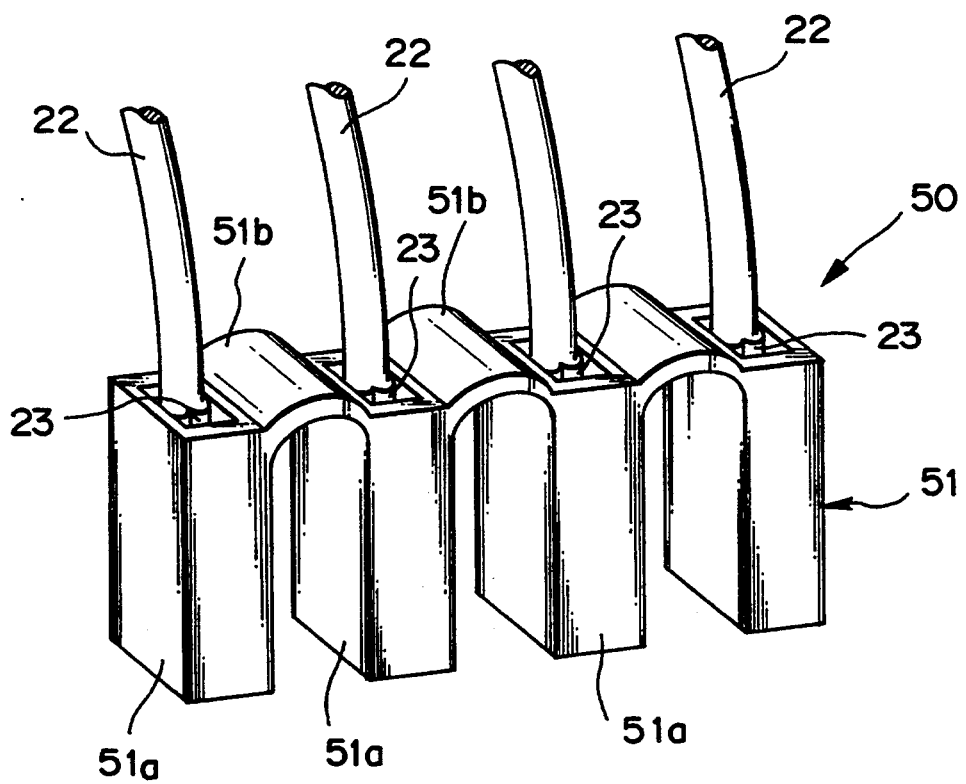
FIG. 20 is a perspective view showing the structure of the female portion of a circuit board connector according to a seventh embodiment.

FIG. 20 is a perspective view showing the structure of a female portion 50 of a circuit board connector according to a seventh embodiment. As shown in FIG. 20, the female portion 50 of the circuit board connector comprises a connector body 51 and connector terminals 23 fitted into the connector body 51 and having signal lines 22 connected thereto. The connector body 51, which consists of synthetic resin or the like, has hollow holding portions 51a for holding corresponding connector terminals 23, and beam portions 51b (readily deformable portions) interconnecting the holding portions 51a, as shown in FIG. 20. Each beam portion 51b is formed into the shape of an arch connecting the upper ends of the holding portions 51a on either side thereof.

Figure 21:
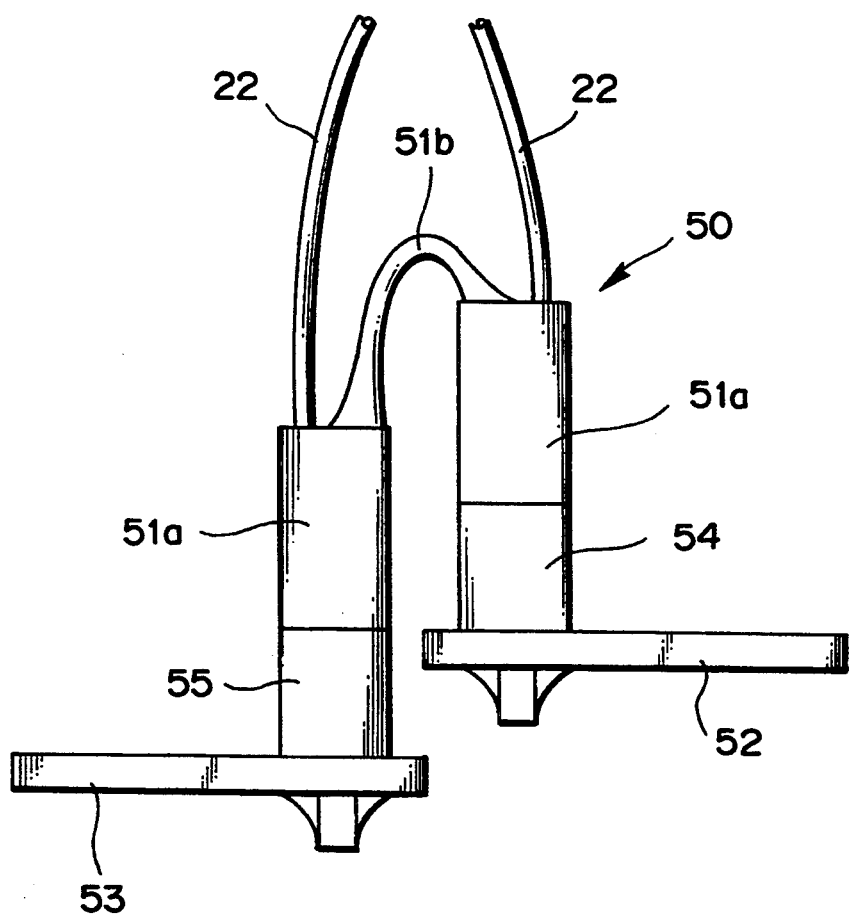
FIG. 21 is a view showing actual use of the female portion of the circuit board connector according to the seventh embodiment.

FIG. 21 is a view showing actual use of the female portion 50 of the circuit board connector thus constructed. As shown in FIG. 21, two circuit boards 52, 53 are not coplanar but are disposed on different levels.

Connector male portions 54, 55 are arranged on the two circuit boards 52, 53, respectively. The female portion 50 of the connector is connected to the male portions 54, 55 of the connector so as to span them and serves to connect the two circuit boards 52, 53 to other electrical circuitry. Since the two circuit boards 52, 53 are on different levels, as described above, the male portions 54, 55 of the connector also are on different levels. However, when the female portion 50 of the connector is connected to the male portions 54, 55 of the connector, the difference in level is absorbed owing to deformation of the beam portion 51b interconnecting the holding portions 51a, and the female portion 50 of the connector is connected to the male portions 54, 55 of the connector without effort. Thus, with the female portion 50 of circuit board connector according to the seventh embodiment, a plurality of circuit boards on levels that differ from one another can be connected by a single connector and mistakes in making connections can be prevented.

Thus, in accordance with the circuit board connectors of the foregoing embodiments described above, the deformation of the low-rigidity portions between the holding portions absorb error in the spacing of the land holes of the circuit board and a difference in thermal expansion so that residual stress in soldered portions can be reduced. This makes it possible to prevent cracking of the solder and peeling off of the circuit patterns.

The present invention is not limited to the above embodiments and various changes and modifications can be made within the spirit and scope of the invention. Therefore, to apprise the public of the scope of the present invention, the following claims are made.

What is claimed is:

1. A circuit board connector in which a plurality of electrical contacts are arranged in a row on a connector body, said connector body comprising:
   a plurality of holding portions for independently holding one of the plurality of electrical contacts; and
   deformable portions flexibly interconnecting said plurality of holding portions in such a manner that said holding portions are capable of moving relative to one another, wherein
   said connector body is formed from a synthetic resin and said deformable portions are integrally molded with said plurality of holding portions, and said deformable portions are formed into fan-shaped ribs, each rib having a first end and a second end, the first ends being connected to one another and the second ends being connected to respective ones of said plurality of holding portions.

2. A plurality of circuit board connectors, with each circuit board connector having a plurality of electrical contacts arranged in a row on a connector body, said connector body, comprising:
   a plurality of holding portions for independently holding one of said plurality of electrical contacts; and
   deformable portions flexibly interconnecting said plurality of holding portions in such a manner that said holding portions are capable of moving relative to one another, wherein
   said plurality of electrical contacts are a plurality of contact pins forming male connectors, said plurality of connector pins being passed through respective pattern holes of a circuit board while being held by said connector body and being soldered to the circuit board, and wherein each holding portion of one circuit board connector is inserted between mutually adjacent holding portions of another circuit board connector, in which state mating is achieved with a plurality of connector pins on the circuit boards.

3. A connector connected to a group of electrical contacts arranged in a curved line on a printed circuit board, comprising:
   a plurality of holding portions to be connected to the electrical contacts;
   a flexible loop connecting portion having one end connected to a side surface of a first holding portion and the other end connected to a side surface of an adjacent second holding portion;
   signal transmission cables for receiving from or transmitting to the printed circuit board a predetermined signal via a connecting portion between each holding portion and the respective electrical contact, wherein
   said plurality of holding portions can be positioned at and connected to the electrical contacts arranged in the curved line due to flexibility in said loop connecting portion.

4. A connector connected to a plurality of electrical contacts continuously arranged on a printed circuit board, with at least some of the electrical contacts being arranged in a straight line, comprising:
   a plurality of holding portions to be connected to the plurality of electrical contacts;
   a flexible loop connecting portion having one end connected to a side surface of a first holding portion and the other end connected to a side surface of an adjacent second holding portion, with said loop connecting portion having a first width at both ends and a second width at a middle portion that is smaller than the first width;
   a plurality of signal transmission cables for receiving from or transmitting to the printed circuit board a predetermined signal via a connecting portion between each holding portion and the respective electrical contact, wherein
   said plurality of holding portions can be connected to the electrical contacts arranged on the printed circuit board due to flexibility in said loop connecting portion.

* * * * *

UNITED STATES PATENT AND TRADEMARK OFFICE
CERTIFICATE OF CORRECTION

PATENT NO. : 5,380,222
DATED : January 10, 1995
INVENTOR(S) : Kobayashi

It is certified that error appears in the above-indentified patent and that said Letters Patent is hereby corrected as shown below:

COLUMN 4:

Line 3, "DRAWING" should read --DRAWINGS--.

COLUMN 8:

Line 10, "of" should be deleted.

Signed and Sealed this

Thirteenth Day of June, 1995

Attest:

BRUCE LEHMAN

Attesting Officer     Commissioner of Patents and Trademarks